(12) United States Patent
de la Puente, Sr. et al.

(10) Patent No.: US 8,149,901 B2
(45) Date of Patent: Apr. 3, 2012

(54) CHANNEL SWITCHING CIRCUIT

(75) Inventors: Edmundo de la Puente, Sr., Cupertino, CA (US); Robert J. Pochowski, Sunnyvale, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 929 days.

(21) Appl. No.: 11/140,097

(22) Filed: May 27, 2005

(65) Prior Publication Data

US 2006/0270357 A1 Nov. 30, 2006

(51) Int. Cl.
*H04B 1/38* (2006.01)

(52) U.S. Cl. ......... 375/219; 375/224; 375/295; 375/316

(58) Field of Classification Search .................. 710/306, 710/100, 3; 714/742; 370/225; 324/765; 345/3.1; 327/407; 348/14.01
See application file for complete search history.

(56) References Cited

U.S. PATENT DOCUMENTS

| | | | | |
|---|---|---|---|---|
| 4,627,045 A | * | 12/1986 | Olson et al. ................... | 370/225 |
| 4,760,524 A | * | 7/1988 | Iwasaki et al. .................... | 710/3 |
| 5,579,488 A | * | 11/1996 | Ikeda ............................. | 710/100 |
| 5,704,048 A | * | 12/1997 | Fleck et al. .................... | 710/306 |
| 5,784,574 A | * | 7/1998 | Tagiri ............................. | 710/100 |
| 5,949,272 A | * | 9/1999 | Bickford et al. .............. | 327/407 |
| 6,380,967 B1 | * | 4/2002 | Sacca .......................... | 348/14.01 |
| 6,847,335 B1 | * | 1/2005 | Chang et al. ................... | 345/3.1 |
| 2004/0085972 A1 | * | 5/2004 | Warren et al. ................. | 370/401 |
| 2007/0245199 A1 | * | 10/2007 | Pochowski .................... | 714/742 |
| 2008/0204065 A1 | * | 8/2008 | Whetsel ........................ | 324/765 |

* cited by examiner

*Primary Examiner* — Dhaval Patel
(74) *Attorney, Agent, or Firm* — Holland & Hart, LLP

(57) ABSTRACT

An active routing circuit. In representative embodiments, the active routing circuit includes a channel switch which includes a transceiver and a switch. The transceiver has first data line, second data line, drive/receive control line, and receiver select control line. The switch has first contact connected to first data line, second contact connected to second data line, and switch control line. In a driver mode, the transceiver can receive data from first data line and output that data to second data line, and in receiver mode, can receive data from second data line and output that data to first data line. The transceiver can switch between driver mode and receiver mode in response to a signal. Data received from the second data line can be blocked in response to another signal. The switch can shift between connecting and disconnecting first contact to/from second contact in response to yet another signal.

19 Claims, 5 Drawing Sheets

CHANNEL SWITCHING CIRCUIT

BACKGROUND

Test and measurement is an important component of modern product development and manufacture. A class of test systems designed to perform these tests automatically are referred to as automated test equipment (ATE). Automated test equipment is typically programmed to automatically execute a number of selected tests on a specific circuit or component. The particular tests performed and the conditions under which they are performed is dependent upon the item being tested, the stage of product development, and the intended application.

An increasingly common packaging technology for electronic circuits is the so called "multi-chip-package (MCP)". In multi-chip-packages several integrated circuit die are mounted together in a single package with the various die often interconnected internally within the package.

The testing of these multi-chip-packages by automated test equipment (ATE) has resulted in a new set of challenges. For instance, multiple die that have been traditionally tested in different test systems are now being integrated into a single package. Multiple insertion testing in different test systems has been used, but there is a penalty paid in the cost of equipment, in additional floor space, in the time required to test the package, in potential damage to the pins of the package, and in the reliability of the package following the multiple insertions.

Also, different types of die require different tester characteristics. A multi-chip-package could have, for example, chips with different types of memories, logic devices, analogue circuits, or even radio-frequency (RF) devices. Ideally these multi-chip-package devices can be tested using the least number of insertions, so that a given test system must be able to do more to perform tests having extra functionality.

Further, the total pin-count on common multi-chip-package devices is much greater than traditional memory chips. Even a pure memory multi-chip-package could have hundred's of pins depending on the manner in which signals are brought out of the package.

In addition, the desire for parallel testing continues to grow. Today a typical test system can test 32 devices under test (DUTs) in parallel. In the near future the testing of 64 devices in parallel is expected. And not too far in the future, machines will need to test 256 or more devices in parallel. This will result in an extraordinary number of test pins on the tester. For example a typical multi-chip-package device could have 384 pins. The total pin count at the interface between the tester and the DUT area for 256 devices in parallel would then be 384×256=98,384 pins per test system. The largest test system currently on the market has 4,608 pins.

In addition, chip speeds also continue to increase. Devices that can go into a multi-chip-package include chips that can run at high frequencies like DDR (Double Data Rate) and DDR2 or fast SRAM (Static Random Access Memory). Current multi-chip-packages include various die that can run up to 133 Mbit/second, but future packages will likely have 200 Mbit/second and 266 Mbit/second die. And, it is expected that the trend toward increased speed will continue.

SUMMARY

In representative embodiments, an active routing circuit is disclosed which comprises a channel switch which comprises a transceiver and a switch. The transceiver has first data line, second data line, drive/receive control line, and receiver select control line. The switch has first contact connected to first data line, second contact connected to second data line, and switch control line. In a driver mode, the transceiver can receive data from first data line and output that data to second data line, and in receiver mode, can receive data from second data line and output that data to first data line. The transceiver can switch between driver mode and receiver mode in response to a signal. Data received from the second data line can be blocked in response to another signal. The switch can shift between connecting and disconnecting first contact to/from second contact in response to yet another signal.

In other representative embodiments, a test system is disclosed which comprises an active routing circuit and a tester. The active routing circuit comprises at least one channel switch. Each channel switch comprises a transceiver having first data line, second data line, drive/receive control line, and receiver select control line and a switch having first contact connected to the first data line, second contact connected to the second data line, and switch control line. The tester has at least one test channel. Each transceiver in driver mode is configured to receive data from its first data line and output that data to its second data line and in receiver mode is configured to receive data from its second data line and output that data to its first data line. Each transceiver is configured to switch between driver mode and receiver mode in response to a signal on its drive/receive control line, and in receiver mode is configured to block data received from its second data line in response to a signal on its drive/receive control line. Each switch is configured to shift between connecting and disconnecting its first contact to/from its second contact in response to a signal on the switch control line. The test channel is connected to the first data line of each channel switch, and each second data line is configured for transferring between a test pin on a device under test and a channel switch paired with the test pin.

Other aspects and advantages of the representative embodiments presented herein will become apparent from the following detailed description, taken in conjunction with the accompanying drawings.

BRIEF DESCRIPTION OF THE DRAWINGS

The accompanying drawings provide visual representations which will be used to more fully describe various representative embodiments and can be used by those skilled in the art to better understand them and their inherent advantages. In these drawings, like reference numerals identify corresponding elements.

DETAILED DESCRIPTION

Figure 1A:
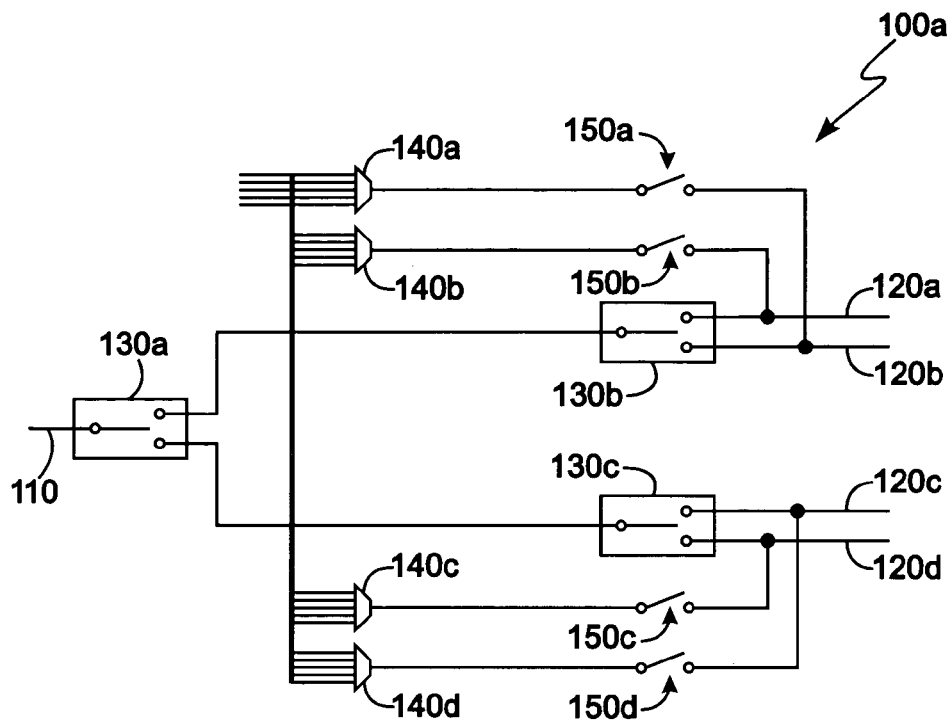
FIG. 1A is a drawing of a routing circuit for routing test channel connections.

As shown in the drawings for purposes of illustration, the present patent document discloses novel techniques for handling large pin-count packages, particularly multi-chip-packages, at fast clock rates. In the following detailed description and in the several figures of the drawings, like elements are identified with like reference numerals.

There is a need to be able to handle an greatly increased number of test pins on a tester. The number of test pins on the largest test system currently on the market falls far short of anticipated requirements.

As circuit speeds increase, multiplexing a single tester channel to drive or receive data to/from multiple device under test pins becomes increasingly difficult if not impossible to do without loosing significant performance. High speed testing requires clean connection paths from the single tester channel to each of the device under test pins. These high speed connections typically require bulky mechanical relays and significant care in the transmission line layouts. Although this is possible and simple to do for some small number of channels, becomes a large task when dealing with thousands of channels that are multiplexing out to even greater numbers of devices. There is not enough space and power to have all these relays and not enough board space to deal with all the layout issues.

The enormous cost and the poor reliability associated with relays compounds this problem even more. High performance relays tend to be pricey. When the cost of each relay is multiplied by the thousands of relays needed for these large systems, the price adds up quickly.

Mechanical relays are also well known to failure over time. There is a lifetime associated with the switching mechanism of a relay. With the increasing numbers of relays needed to switch all these channels, mean time between failure (MTBF) which is a key measure of quality is compromised by the probability of failure from the large number of mechanical switches.

One means by which the gap between the current tester pin count of 4608 and the anticipated pin count need of 98,384 can be closed is by recognizing that not all die are tested simultaneously. In other words, a group of tester channels can be routed to different groups of pins. For example the required number of test points can be divided into N groups of M channels providing the ability to test up to N die each having up to M pins. This provides the ability to scale a given channel count by N. Assuming identical die in a multi-chip-package, N each having up to M pins could be tested in parallel.

In representative embodiments, re-routing circuitry between the output of the pin electronics on the test system and the multi-chip-package (the device under test) is disclosed that would permit sequentially moving a group of tester resources from one group of pins associated with a particular die to the next group of pins associated with the next die, until all die in the package are tested.

FIG. 1A is a drawing of a routing circuit 100a for routing test channel connections. The routing circuit 100a of FIG. 1A could be referred to as tree routing circuit 100a. The implementation of FIG. 1A is passive in that only passive devices are used in the circuit. This circuit can be preferably implemented using relays. The topology is such that it avoids stubs, thereby maintaining signal integrity. In the example of FIG. 1A, an input line 110 is connected to a selected one of four output lines 120a,120b,120c,120d, collectively referred to as output lines 120. By choosing appropriate contact positions for contact in line switches 130a,130b,130c, collectively referred to as line switches 130, the input line 110 can be connected to a specific output line 120. The multiplexers 140a,140b,140c,140d, collectively referred to as multiplexers 140, can select from the voltages applied to their inputs, and closing any or all of the four latching switches 150a,150c, 150c,150d, collectively referred to as latching switches 150, as appropriate can apply the selected multiplexer 140. While other than relays, for example solid state switches, could be used in the representative embodiment of FIG. 1A the low parasitic capacitance of relays provides operational speed advantages.

Figure 1B:
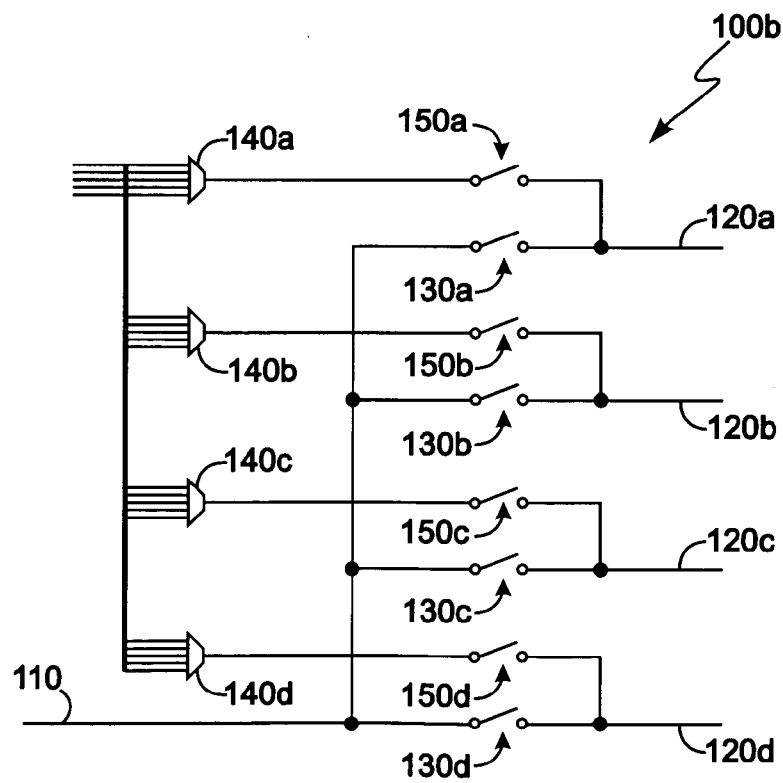
FIG. 1B is a drawing of another routing circuit for routing test channel connections.

FIG. 1B is a drawing of another routing circuit 100b for routing test channel connections. The routing circuit 100b of FIG. 1B could be referred to as parallel routing circuit 100b. The implementation of FIG. 1B is also passive in that only passive devices are used in the circuit. In the example of FIG. 1B, an input line 110 is connected to a selected one of four output lines 120a,120b,120c,120d. By choosing appropriate contact positions for contact in line switches 130a,130b, 130c,130d, collectively referred to as line switches 130, the input line 110 can be connected to a specific output line 120 or multiple output lines 120. The multiplexers 140a,140b, 140c,140d can select from the voltages applied to their inputs, and closing any or all of the four latching switches 150a,150c, 150c,150d, as appropriate can apply the selected multiplexer 140. FIG. 1B preferably uses solid-state switches for the latching switches 150 and is implemented in as an integrated circuit (IC). The dimensions inside the integrated circuit are small enough that multiple switches can be tied to a single node together without causing significant signal degradation. The relay tree routing circuit 100a embodiment of FIG. 1A typically will have a higher bandwidth, but it requires mechanical relays or some form of low on resistance and low capacitance switches to obtain these characteristics. The disadvantages of the embodiment of FIG. 1A are basically the space, cost, and reliability inherent in relays. Since it is integrated using solid-state switches, the parallel routing circuit 100b of FIG. 1B requires less board space, is not expensive, and will have much better reliability than the tree routing circuit 100a of FIG. 1A. The disadvantage of the parallel routing circuit 100b is performance. Solid-state switches have parasitic capacitances and ON resistances that will reduce the overall bandwidth. Thus, the parallel routing circuit 100b will not have as good of a high frequency response as the tree routing circuit 100a when implemented using solid-state switches. The parallel routing circuit 100b could be implemented using relays, but for large numbers of test pins on a device under test, the larger number of relays necessary especially for greater fan-outs and associated space requirements would make relays less than ideal. The larger numbers of relays could also become a reliability problem.

Figure 2A:
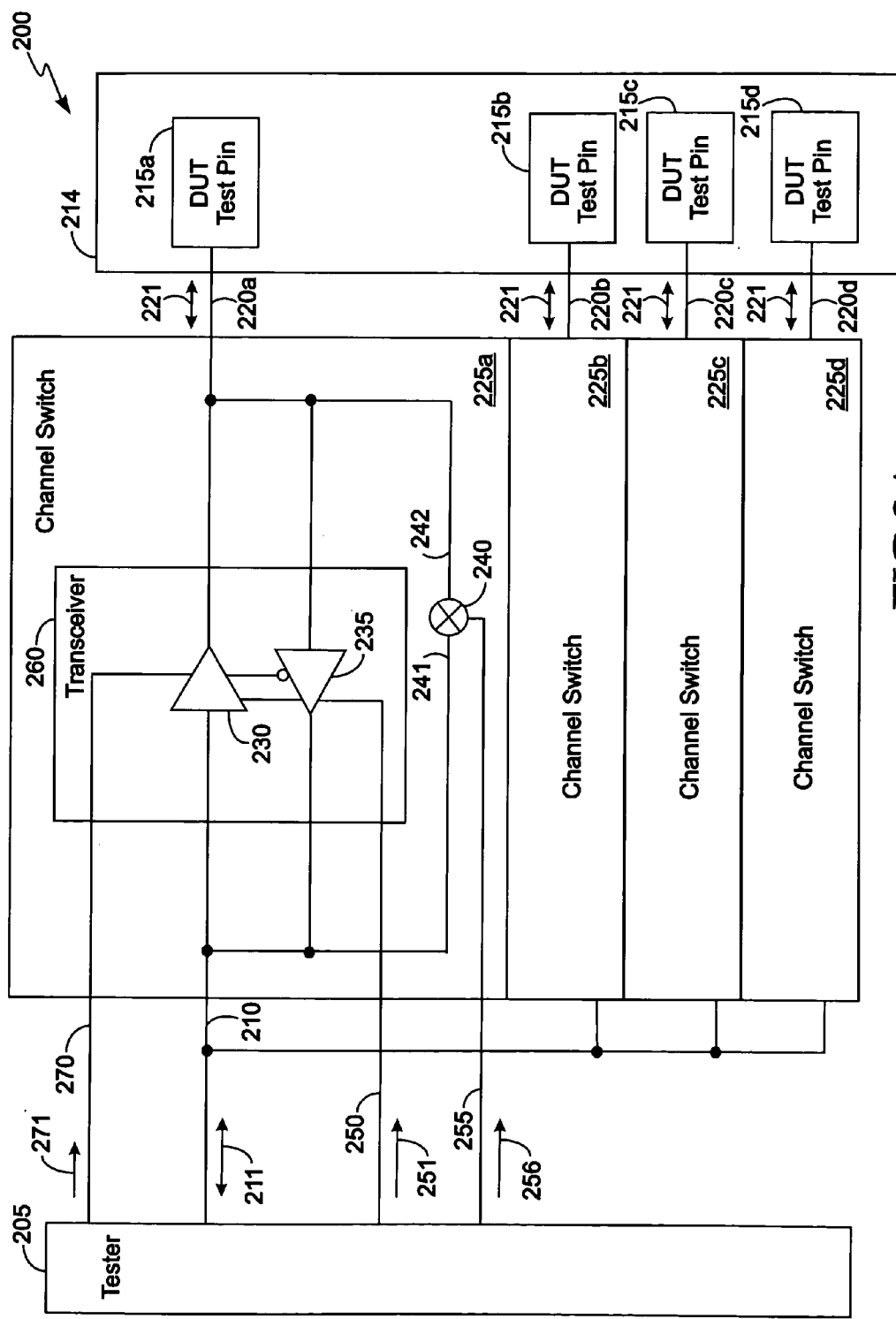
FIG. 2A is a drawing of a routing circuit for routing test channel connections as described in various representative embodiments.

FIG. 2A is a drawing of a routing circuit 200 for routing test channel connections as described in various representative embodiments. The routing circuit 200 is also referred to herein as active routing circuit 200 and can be configured to drive data 211 from a tester 205 at tester line 210, also referred to herein as tester transmission line 210 and as a first data line 210, to any or all of a first, a second, a third, and a fourth device under test pin 215a,215b,215c,215d, referred to collectively as device under test pins 215 and as test pins 215, at a first, a second, a third, and a fourth DUT (device under test) pin lines 220a,220b,220c,220d, referred to collectively as DUT pin lines 220, as DUT transmission lines 220, and as second data line 220, or to receive DUT data 221 from any or all of the first, the second, the third, and the fourth device under test pins 215a,215b,215c,215d at DUT pin lines 220a, 220b,220c,220d and to transmit the received data to the tester 205 at tester line 210. The tester line 210 is connected to tester 205 data line and to a first, a second, a third, and a fourth channel switch 225a,225b,225c,225d, referred to collectively as channel switches 225, data lines. Data flows between the tester 205 and the channel switches 225 via the tester line 210.

The device under test pins 215 are pins on a device under test 214, which could be in representative embodiments a multi-chip-package 214 comprising several individual electronic circuits and devices.

Each of the channel switches 225 comprises a transceiver 260 and a switch 240, wherein the switch 240 has a first contact 241 and a second contact 242. Each transceiver 260 in turn comprises a driver 230 and a receiver 235 wherein the input of the driver 230 is connected to the output of the receiver 235, and the output of the driver 230 is connected to the input of the receiver 235. Data 211 originating in the tester 205 is driven into the driver 230 via tester line 210. The driver 230 then drives the data 211 as DUT data 221 into the device under test pin 215 via DUT pin line 220. In operation, the channel switch 225 can be located close to the device under test pin 215 and thereby only needs to drive a short transmission line, i.e., the DUT pin line 220, whereas the tester 205 may need to drive a longer transmission line, i.e., the tester line 210. Depending upon the application, DUT pin lines 220 may only be a few inches, whereas the tester lines may be a few feet or more in length. As such, the capacitive loading on the devices under test 214 can be reduced and the channel switches 225 provide buffering for the data signals.

A drive/receive control signal 271 on a drive/receive control line 270 switches the channel switch 225 between a condition of receiving a data signal 211 from the tester 205 and driving the DUT data signal 221 into the device under test pin 215 to a condition of receiving DUT data signals 221 from the devices under test 214 and transmitting the resultant data signal 211 to the tester 205. A receiver select control signal 251 on a receiver select control line 250 enables a specific receiver 235 when the channel switches 225 are in the condition of receiving DUT data signals 221 from the devices under test 214 and transmitting the resultant data signal 211 via the selected receiver 235 to the tester 205. A parametric test control signal 256 on parametric test control line 255, also referred to herein as switch control line 255, turns switch 240 ON and OFF. When the switch 240 is ON, the driver 230 and the receiver 235 are disabled (shorted out) and the channel switch 225 is in condition to perform a parametric test by connecting the first contact 241 to the second contact 242. When the switch 240 is OFF, the first and second contacts 241,242 are opened or disconnected.

The receiver select control line 250 and parametric test control line 255 are independently controlled per output. These are low speed control signals that do not preferably come directly from the tester 205 because it would require significant number of connections. Instead the tester 205 preferably communicates serially with a controller built into the switch 240 module.

Each of the second, third, and fourth channel switches 225b,225c,225d is a replica of the first channel switch 225a shown in FIG. 2A. Note that in FIG. 2A that receiver select control line 250 and parametric test control line 255 are shown as connected only to the first channel switch 225a whereas they would be also connected to the second, third, and fourth channel switches 225b,225c,225d.

Figure 2B:
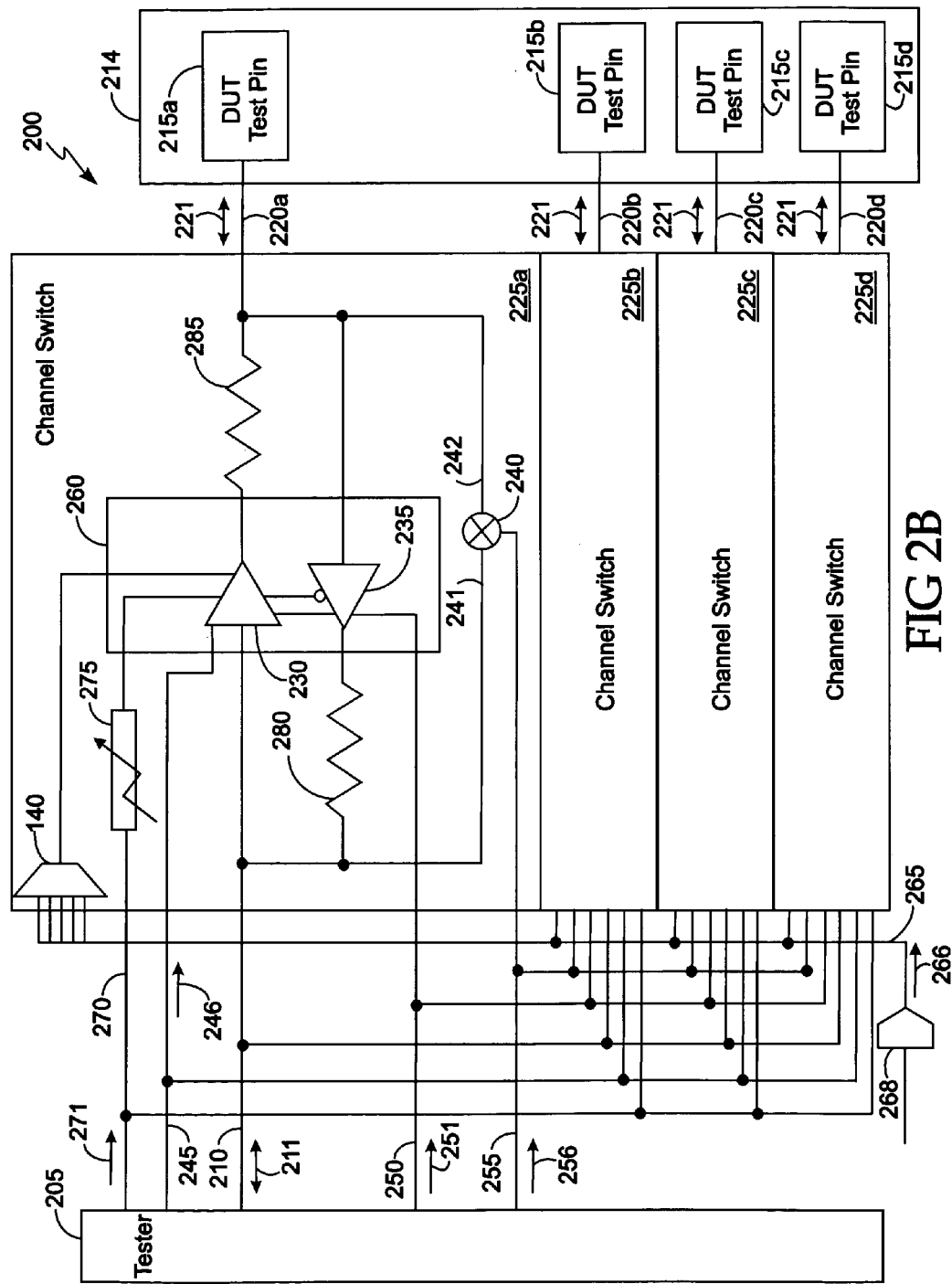
FIG. 2B is a drawing of another routing circuit for routing test channel connections as described in various representative embodiments.

FIG. 2B is a drawing of another routing circuit 200 for routing test channel connections as described in various representative embodiments. The 10 routing circuit 200 of FIG. 2B is also referred to herein as active routing circuit 200 and can be configured to drive data 211 from the tester 205 at tester line 210 to any or all of the first, the second, the third, and the fourth devices under test 215a,215b,215c,215d at the first, the second, the third, and the fourth DUT pin lines 220a,220b,220c,220d or to receive data 211 from any or all of the first, the second, the third, and the fourth device under test pins 215a,215b,215c,215d at DUT pin lines 220a,220b,220c, 220d and to transmit the received data to the tester 205 at tester line 210. The tester line 210 is connected to tester 205 data line and to the first, the second, the third, and the fourth channel switch 225a,225b,225c,225d, referred to collectively as channel switches 225, data lines. Data flows between the tester 205 and the channel switches 225 via the tester line 210.

Each of the channel switches 225 comprises the transceiver 260, the multiplexer 140, a delay line 175, a first resistor 285, a second resistor 280, and the switch 240. Each transceiver 260 in turn comprises the driver 230 and the receiver 235 wherein the input of the driver 230 is connected to the output of the receiver 235, and the output of the driver 230 is connected to the input of the receiver 235. Data originating in the tester 205 is driven into second resistor 280 and on into the driver 230 via tester line 210. The driver 230 then drives the data into the first resistor 285 and on into the device under test pin 215 via the DUT pin line 220. In operation, the channel switch 225 can be located close to the device under test pin 215 and thereby only needs to drive a short transmission line, i.e., the DUT pin line 220, whereas the tester 205 may need to drive a longer transmission line, i.e., the tester line 210. Depending upon the application, DUT pin lines 220 may only be a few inches, whereas the tester lines may be a few feet or more in length. As such, the capacitive loading on the devices under test 214 can be reduced and the channel switches 225 provide buffering for the data signals.

A drive/receive control signal 271 on a drive/receive control line 270 switches the channel switch 225 between a driver mode, which is a condition of receiving a data signal 211 from the tester 205 and driving the DUT data signal 221 into the device under test pin 215 to a receiver mode, which is a condition of receiving DUT data signals 221 from the devices under test 214 and transmitting the resultant data signal 211 to the tester 205. The drive/receive control signal 271 is delayed by a delay line 275 as necessary for correctly timed switching between the drive and receive mode of the transceiver 260. A receiver select control signal 251 on a receiver select control line 250 enables a specific receiver 235 when the channel switches 225 are in the condition of receiving DUT data signals 221 from the devices under test 214 and transmitting the resultant data signal 211 via the selected receiver 235 to the tester 205. A parametric test control signal 256 on parametric test control line 255 turns switch 240 ON and OFF. When the switch 240 is ON, the driver 230 and the receiver 235 are disabled (shorted out) and the channel switch 225 is in condition to perform a parametric test. A transceiver control signal 246 on transceiver control line 245 either enables or disables the driver 230 and the receiver 235. In the disabled mode, the output of the driver 230 is set to the value of the output of the multiplexer 140. The output of a digital to analog converter 268 is a disable/default value signal 266. The disable/default value signal 266 on disable/default value line 265 sets the value of the output of the multiplexer 140 and which in the disabled mode just described the output of the driver 230 is set. Each of the second, third, and fourth channel switches 225b,225c,225d is a replica of the first channel switch 225a shown in FIG. 2B.

The drive/receive control signal 271 controls switching from drive to receive dynamically. The tester's 205 pattern generator can control the drive/receive control signal 271 such that it can be synchronized to the pattern execution. This drive/receive control signal's 271 timing also needs calibration to match the overall timing for the drive and compare waveforms. Some applications in other representative embodiments could tolerate switching from drive to receive mode by having the tester 205 send a command to change the state. This would be a much slower method, but significantly simpler to implement.

The switch 240 provides a path to by-pass the active transceiver 260. This switch 240 is needed to be able to perform parametric testing directly on each device under test pin 215. Test equipment typically has a Parametric Measurement Unit (PMU) that can be connected to a device under test pin 215 and before starting any functional testing it can measure "opens" (looking for connectivity between the tester 205 and the device under test pin 215) and "shorts" (looking for electrically shorted pins to something else). The switch 240 can be implemented with a small solid-state switch or other appropriate switch. The switch 240 should be small enough to add minimum capacitance to the node and still satisfy current requirements going out. Typical currents for these parametric tests are −20 uA, so this can be made very small.

In representative embodiments, both the driver 230 and the receiver 235 can be unity gain followers. They require high bandwidth to replicate the waveform seen at the input. The driver 230 uses the first resistor 285, also referred to herein as the first back match resistor 285, to match the load on the line at the output of the driver so as to absorb any signal reflections from the device under test pin 215. A typical value for the first resistor 285 is 50 ohms. Serial back matching implies point to point interconnect which is typically the case for applications. The drive waveform then will reflect back from the device under test pin 215 and terminate using the first resistor 285.

The receiver 235 performs similar operations as that of the driver 230, except that it receives the waveform from one of the device under test pins 215 and sends it to the tester 205 pin electronics comparators. The receiver 235 uses the second resistor 280, also referred to herein as the second back match resistor 280, to match the load on the line, i.e., the interface impedance of the line, at the output of the receiver 235 so as to absorb any signal reflections from the tester 205. Again a typical value for the second resistor 280 is 50 ohm in order to match the tester 205 interface impedance. Only one receiver 235 can drive the tester 205 pin electronics comparator. This is accomplished by enabling only a single transceiver 260 at a time using the receiver select control signal 251 on the receiver select control line 250. The receiver select control signal 251 as opposed to the drive/receive control signal 271 doesn't need to be controlled by the pattern generator. Switching from one output to the next is a slow operation and can be handled by the tester 205 controller.

The driver 230 and receiver 235 can be turned OFF using the transceiver control signal 246. When the driver 230 and the receiver 235 are OFF, it is possible to pre-set a default voltage state defined by the disable/default value signal 266. The multiplexer 140 allows the user to select a default voltage that the device under test pin 215 will be driven to when the transceiver 260 is disabled. There can be several pre-set voltages that, under program control, the user can select. During this state also, the receiver 235 will float. This will allow other receivers 235 to gain access to the common tester line 210. When both the output of the multiplexer 140 and the driver 230 are disabled, the output of the driver 230 will float. This condition will be needed for either parametric measurements through the switch 240 or to isolate the device under test pin 215 from the tester 205. FIG. 2B also shows a delay line for the drive/receive control signal 271. Depending upon the desired timing accuracy, this delay line could be tweaked during layout to minimize the skew across all four channel switches 225, or could be statically programmed using the serial bus to adjust delay differences.

Table 1 summarizes the states of the driver 230, the receiver 235, the switch 240, and the multiplexer 140 output for the various operational modes of the channel switch 225.

TABLE 1

| CHANNEL SWITCH MODE | DRIVER | RECEIVER | PARAM. SWITCH | MUX |
|---|---|---|---|---|
| Drive One Tester Channel to One DUT Pin | ON (only one output) | OFF | OFF | OFF |
| Drive One Tester Channel to All DUT Pins | ON (all outputs) | OFF | OFF | OFF |
| Compare one DUT Pin | OFF | ON | OFF | OFF |
| Parametric Test | OFF | OFF | ON | OFF |
| Output Locked | OFF | OFF | OFF | ON |

Figure 3:
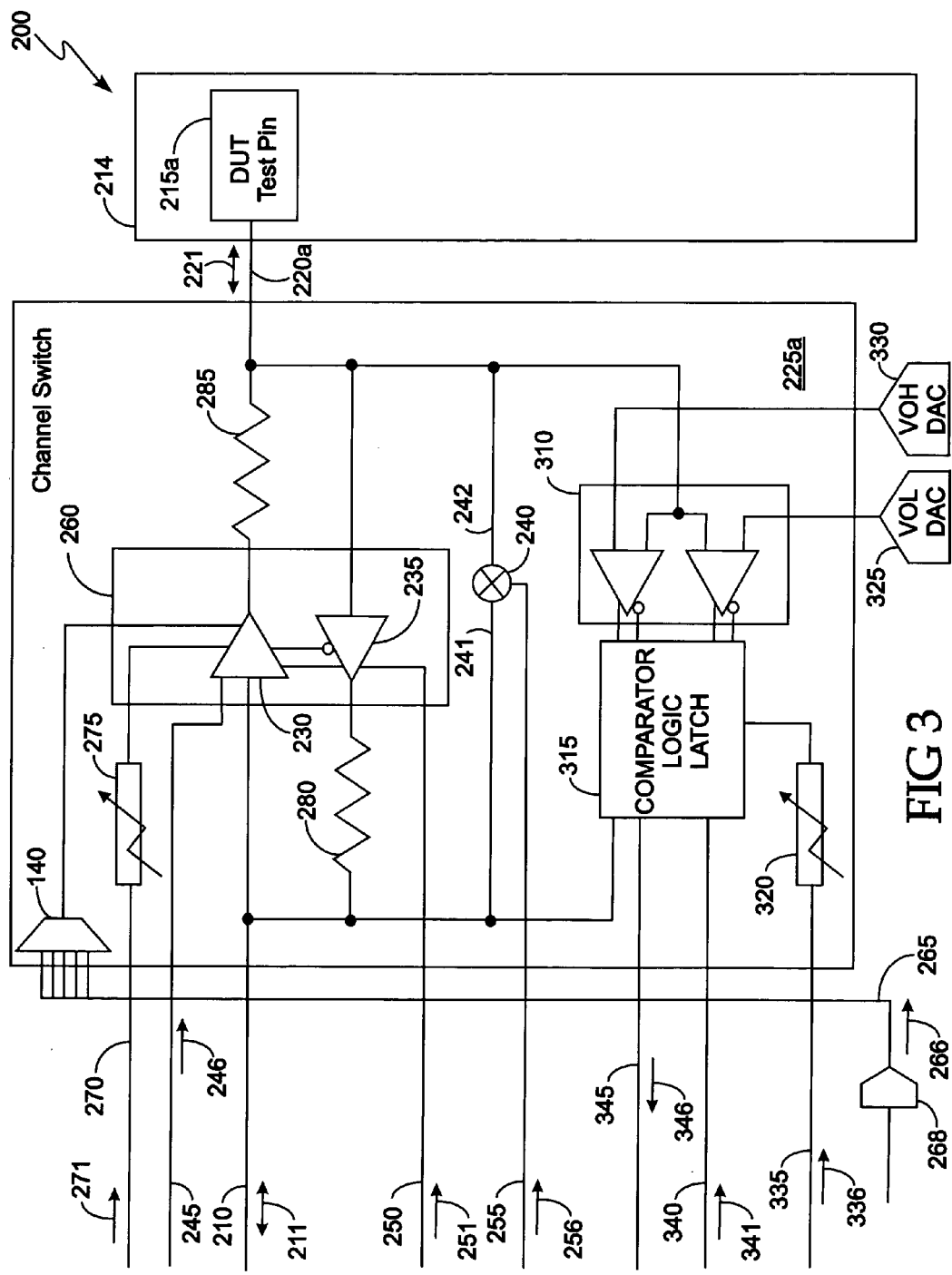
FIG. 3 is a drawing of still another routing circuit for routing test channel connections as described in various representative embodiments.

FIG. 3 is a drawing of still another routing circuit 200 for routing test channel connections as described in various representative embodiments. In FIG. 3, a dual level analog comparator 310, also referred to herein as a dual comparator 310, a comparator logic latch 315, and another delay line 320 are included in each channel switch 225. This implementation is capable of comparing all device under test pins 215 simultaneously instead of sequencing through one device under test pin 215 at the time. In this embodiment, all device under test pins 215 must be running the same pattern and must have the same expected data. This situation would be true for applications wherein the multi-chip-package contains the same memory type or for other multi-device test applications which has increased parallelism. If the devices in a multi-chip-package under test are of different types, then testing can proceed by sequencing one device at a time. Even in such case, there is a significant improvement in testing, as the testing can be performed in a single insertion of the multi-chip-package into the test head holder.

If the devices under test are of the same type, and if the test is being performed in parallel, then only a single "expected data" line per pin is needed on multiple devices to be tested. Adding lines between the tester 205 and the channel switch 225 area is typically difficult. So, instead of adding more tester lines 210 between the tester 205 and the channel switches 225, the same tester line 210 can be used to bring the expected logic level from the channel switches 225 to the tester 205. This will require a special mode in the system's formatter to continue to drive waveforms even in a compare cycle, however the waveforms here represent compare expected values. In other words, tester line 210 can perform the following dual functions: (1) when driving waveforms to the device under test 214, the tester 205 sends the data signal 211 out through tester line 210 and (2) when the device under test 214 is sending data back to the tester 205 (compare cycles), tester line 210 becomes the expected data. This eliminates the need to add a second line per tester channel to send the expected data from the tester 205 to the remotely located dual comparators 310.

The dual comparator 310 has a local voltage output low voltage reference (VOL DAC) 325, also referred to herein as a low voltage reference 325, and a local voltage output high voltage reference (VOH DAC) 330, also referred to herein as a high voltage reference 330, Each dual comparator 310 receives data from one device under test pin 215 and performs a voltage comparison to the levels of the outputs of VOH DAC 330 an VOL DAC 325. The result is then passed to the comparator logic latch 315 where it will be matched to a logic expected value. The expected data is received via the tester line 210.

There is a mask bit per comparator logic latch 315 or device under test pin 215. Therefore, if a device under test pin 215 is not present or has failed, it can be removed from the error tree and avoid generating any additional errors. The mask bits are static and can be controlled via the serial bus.

The comparator logic latch 315 also receives a timing reference signal, an error timing signal 336, on error timing line 335 that tells it when to latch the error. The error timing signal 336 is also received per channel switch 225, but at the system level could be one global signal per device under test group since we are running all device under test pins 215 together as a bus. Note that the error timing signal 336 contains timing information and needs calibration so that it aligns with the device under test pin 215 output. In FIG. 3 there is a delay line 320 per device under test pin 215 output. This will allow de-skewing the output-to-output timing. Further timing alignment for the error timing signal 336 should be done at the system level in the timing generators.

The dual comparators 310 also receive a reset error signal 341 on reset error line 340 to clear previous error results. The pattern generator should be able to control this signal to reset errors while running a pattern. This is also a global signal per device under test group.

In addition, the error result signal 346 is sent out separately on error result line 345 for each device under test pin 215 so that it can be grouped with the other device under test spin 215 errors externally into a global per device under test error. This groping can be accomplished with a programmable logic device which could be, for example, a field programmable gate array (FPGA) or a complex programmable logic device (CPLD).

TABLE 2

| CHANNEL SWITCH MODE | DRIVER | RECEIVER | PARAM. SWITCH | MUX | CMP |
|---|---|---|---|---|---|
| Drive One Tester Channel to One DUT Pin | ON (only one output) | OFF | OFF | OFF | DIS |
| Drive One Tester Channel to All DUT Pins | ON (all outputs) | OFF | OFF | OFF | DIS |
| Compare one DUT Pin | OFF | ON | OFF | OFF | DIS |
| Compare All DUT Pins | OFF | OFF | OFF | OFF | ENA |
| Parametric Test | OFF | OFF | ON | OFF | DIS |
| Output Locked | OFF | OFF | OFF | ON | DIS |

In addition to the modes shown in Table 1, Table 2 shows the additional of "Compare All DUT Pins" with the state of other circuitry. In Table 2, "DIS" means disabled, and "ENA" means enabled.

Figure 4:
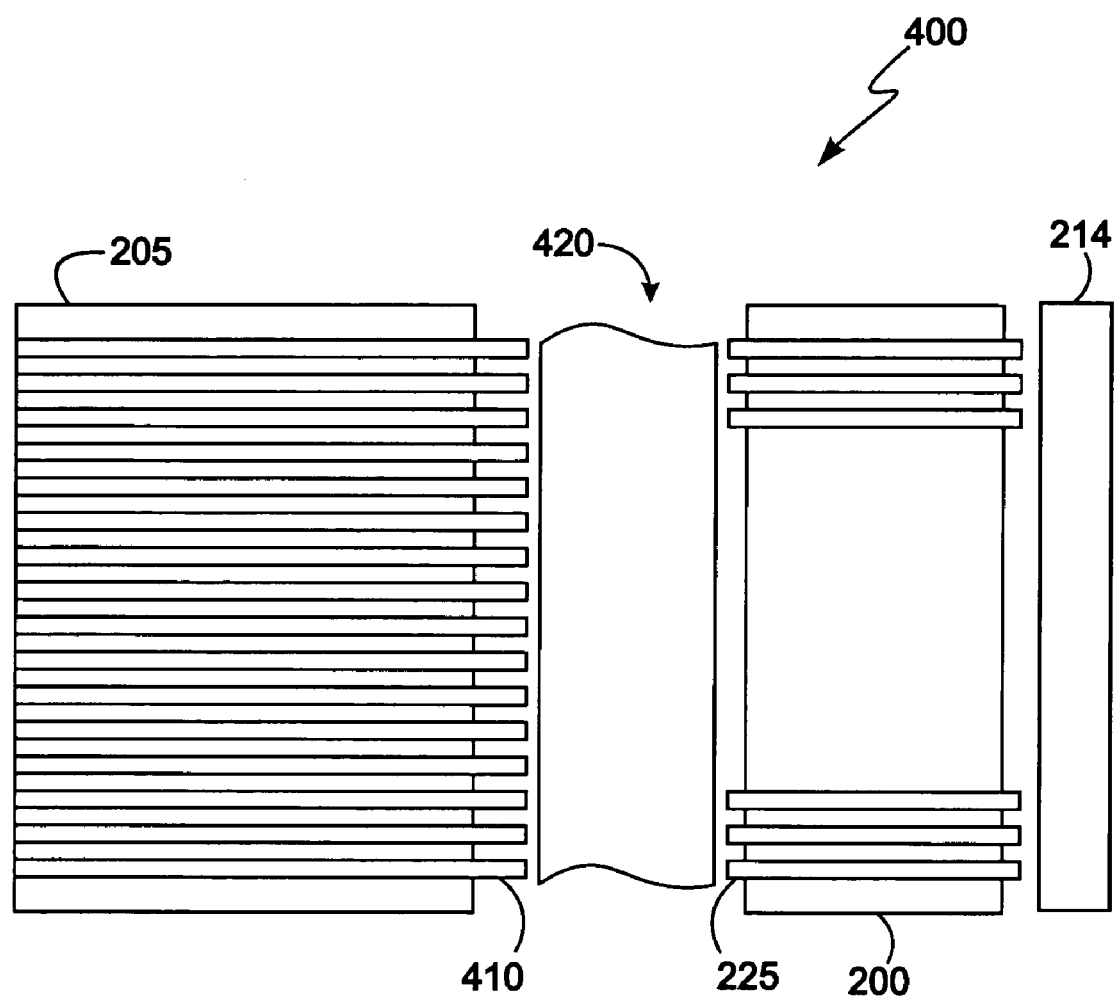
FIG. 4 is a drawing of an automatic test system as described in various representative embodiments.

FIG. 4 is a drawing of a test system 400 as described in various representative embodiments. In representative embodiments, the test system 400 which could be, for example, automatic test system (ATE) 400 comprises the tester 205 which comprises at least one test channel 410, an interface 420, and at least one active routing circuit 200. Each test channel 410 connects to at least one channel switch 225 as shown in FIGS. 2A-2B. Each channel switch 225 connects to one DUT test pin 215 on device under test 214, which in representative embodiments could be multi-chip packages 214.

In representative embodiments, the channel switches 225 contains the active channel circuitry just described. These devices could be placed in close proximity to the device under test 214, thereby enhancing the electrical interface between the device under test 214 and the transceivers 260. The interface 420 can be constructed using coaxial cables or flex-circuit boards. The interface 420 needs to provide electrical connectivity and also physical space transformation between the test channel 410 pin electronic board pattern and the specific handler configuration. The cable interface 420 separates the test system pin electronics away from the device under test 214. Placing the transceivers 260 after the interface 420, minimizes the effective device under test 214 to tester 205 electrical length.

There are several advantages of the representative embodiments disclosed herein. In particular, the channel switches 225 overcome the speed issue associated with a fully integrated solution using solid-state switches. By having the transceivers 260 in the data path, the associated parasitics associated with solid-state switches is eliminated. Also, the connection path between the tester 205 channel and the device under test pin 215 is improved. With a solid-state switch the tester 205 and the device under test 214 must drive the entire length of the line. With the transceiver 260, the line is broken into two better manageable segments. The transceiver 260 is back matched with the first and second resistors 280,285 so that it can cleanly drive the signal in either direction. This will directly translate into improved signal integrity. And, solid-state switch lumped capacitance requires some form of inductive compensation. The effectiveness of the compensation depends on the frequency. At higher frequencies it is much more difficult to compensate and there will always be some form of disturbance on the waveform. This disturbance translate into timing accuracy errors. The transceiver 260 approach eliminates all of that. Further, during a receive cycle (device under test 214 driving), the total line length seen by the device under test 214 is significantly reduced. This is very important since low power devices under test 214 cannot effectively drive long transmission lines and typically there is a timing penalty associated with attempting to do so. The transceivers 260 are small enough that could be built near the device under test 214, and the total transmission length could be reduced to approximately 6 inches from typical lengths of 18 inches today. Also, the performance of the channel switches 225 as disclosed herein can be as good a relay tree implementation, but because it can be integrated into an integrated circuit (IC), the total amount of space required on the board is greatly reduced. Other issues also such as cost and reliability compared to relays are significantly reduced. And, in representative embodiments two important applications: (1) driving from a single source to multiple outputs sequentially (DEMUX functionality) and (2) driving all outputs with the same stimulus simultaneously (FANOUT functionality) can be fulfilled. Neither the relay tree of FIG. 1A nor the DEMUX switch of FIG. 1B is capable of doing this. This versatility is significantly important for multi-chip-packaging applications. The same circuit can be used to do both: DEMUX or FANOUT. And further, the addition of the dual comparator 310 and comparator logic latch 315 to the signal received from each device under test pin 215 will significantly reduce the total pin electronics count of the tester 205. Without this the only way to test multiple devices would be to have N number of data busses directly connected to tester channels. A channel switch 225 application with 40 address, 6 CS and 32 data only uses 96 tester channels. Without the channel switches 225 the system would require 192 tester channels.

As is the case, in many data-processing products, the systems described above may be implemented as a combination of hardware and software components. Moreover, the functionality required for use of the representative embodiments may be embodied in computer-readable media (such as floppy disks, conventional hard disks, DVDs, CD-ROMs, Flash ROMs, nonvolatile ROM, and RAM) to be used in programming an information-processing apparatus to perform in accordance with the techniques so described.

The term "program storage medium" is broadly defined herein to include any kind of computer memory such as, but not limited to, floppy disks, conventional hard disks, DVDs, CD-ROMs, Flash ROMs, nonvolatile ROM, and RAM.

The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. An active routing circuit, comprising:
   a channel switch, comprising:
   a transceiver having first data line, second data line, drive/receive control line, and receiver select control line, wherein the transceiver in a driver mode is configured to receive data from the first data line and output that data to the second data line, wherein the transceiver in a receiver mode is configured to receive data from the second data line and output that data to the first data line, wherein the transceiver is configured to switch between the driver mode and the receiver mode in response to a signal on the drive/receive control line, and wherein the transceiver in the receiver mode is configured to block data received from second data line in response to a signal on the receiver select control line; and
   a switch having first contact connected to the first data line, second contact connected to the second data line, and switch control line, wherein the switch is configured to shift between connecting and disconnecting the first contact to/from the second contact in response to a signal on the switch control line.

2. The active routing circuit as recited in claim 1, further comprising:
   a first resistor, wherein the second data line is a transmission line, wherein the value of the first resistor substantially matches the interface impedance of the second data line, and wherein the first resistor is interposed between the second data line and the transceiver.

3. The active routing circuit as recited in claim 1, further comprising:
   a second resistor, wherein the first data line is a transmission line, wherein the value of the second resistor substantially matches the interface impedance of the first data line, and wherein the second resistor is interposed between the first data line and the transceiver.

4. The active routing circuit as recited in claim 1, further comprising:
   a first resistor, wherein the second data line is a transmission line, wherein the value of the first resistor substantially matches the interface impedance of the second data line, and wherein the first resistor is interposed between the second data line and the transceiver; and
   a second resistor, wherein the first data line is a transmission line, wherein the value of the second resistor substantially matches the interface impedance of the first data line, and wherein the second resistor is interposed between the first data line and the transceiver.

5. The active routing circuit as recited in claim 1, further comprising:
   a delay line connected between the transceiver and the drive/receive control line, wherein the delay line appropriately adjusts the timing of the transceiver shifting between driver mode and receiver mode in response to the signal on the drive/receive control line.

6. The active routing circuit as recited in claim 1, further comprising:
   a multiplexer; and
   a transceiver control line, wherein in response to a signal on the transceiver control line, the potential of the second data line is held at a value determined by the multiplexer output.

7. The active routing circuit as recited in claim 1, further comprising:
   at least one additional channel switch, wherein the channel switches have their first data lines connected together.

8. The active routing circuit as recited in claim 1, wherein the first data line is connected to a tester and wherein the second data line is connectable to a test pin of a device under test.

9. An active routing circuit comprising:
   a channel switch, comprising:
   a transceiver having first data line, second data line, drive/receive control line, and receiver select control line, wherein the transceiver in a driver mode is configured to receive data from the first data line and output that data to the second data line, wherein the transceiver in a receiver mode is configured to receive data from the second data line and output that data to the first data line, wherein the transceiver is configured to switch between the driver mode and the receiver mode in response to a signal on the drive/receive control line, and wherein the transceiver in the receiver mode is configured to block data received from the second data line in response to a signal on the receiver select control line; and
   a switch having first contact connected to the first data line, second contact connected to the second data line, and switch control line, wherein the switch is configured to shift between connecting and disconnecting the first contact to/from the second contact in response to a signal on the switch control line;
   a dual level analog comparator configured to compare the signal level on the second data line against values of a low voltage reference and a high voltage reference; and
   a comparator logic latch configured to receive input signals from the dual level analog comparator, to perform a match against a logic expected value, and to report an error should the match not be obtained.

10. The active routing circuit as recited in claim 9, wherein the comparator logic latch is configured to receive the logic expected value via the first data line.

11. A test system, comprising:
    an active routing circuit comprising at least one channel switch, wherein each channel switch, comprises:
    a transceiver having first data line, second data line, drive/receive control line, and receiver select control line and
    a switch having first contact connected to the first data line, second contact connected to the second data line, and switch control line; and a tester having at least one test channel; wherein each transceiver in driver mode is configured to receive data from its first data line and output that data to its second data line, wherein the each transceiver in receiver mode is configured to receive data from its second data line and output that data to its first data line, wherein the each transceiver is configured to switch between the driver mode and the receiver mode in response to a signal on its drive/receive control line, wherein the each transceiver in receiver mode is configured to block data received from its second data line in response to a signal on its receiver select control line, wherein each switch is configured to shift between connecting and disconnecting its first contact to/from its second contact in response to a signal on the switch control line;

wherein each of the at least one test channel is connected to the first data line of respective one or more of the at least one channel switch; and wherein each second data line is configured for connection to a respective test pin on a device under test.

12. The test system as recited in claim 11, wherein each of the at least one channel switch comprises:

a first resistor coupled to the second data line, wherein the second data line of the channel switch is a transmission line and wherein the value of the first resistor substantially matches the interface impedance of the second data line.

13. The test system as recited in claim 11, wherein each of the at least one channel switch comprises:

a second resistor coupled to the first data line, wherein the first data line of the channel switch is a transmission line and wherein the value of the second resistor substantially matches the interface impedance of the first data line.

14. The test system as recited in claim 11, wherein each of the at least one channel switch comprises:

a first resistor coupled to the second data line, wherein the second data line of the channel switch is a transmission line and wherein the value of the first resistor substantially matches the interface impedance of the second data line; and a second resistor coupled to the first data line, wherein the first data line of the channel switch is a transmission line and wherein the value of the second resistor substantially matches the interface impedance of the first data line.

15. The test system as recited in claim 11, wherein each of the at least one channel switch comprises:

a delay line connected between the transceiver and the drive/receive control line of the channel switch, wherein the delay line appropriately adjusts the timing of the transceiver shifting between driver mode and receiver mode in response to the signal on the drive/receive control line.

16. The test system as recited in claim 11, wherein each of the at least one channel switch comprises:

a multiplexer; and a transceiver control line, wherein in response to a signal on the transceiver control line, the potential of the second data line of the channel switch is held at a value determined by the multiplexer output.

17. The test system as recited in claim 11, wherein:

the at least one channel switch comprises a plurality of channel switches; and each of the at least one test channel is connected to the first data lines of a respective plurality of the plurality of channel switches.

18. The test system as recited in claim 11, wherein each of the at least one channel switch comprises:

a dual level analog comparator configured to compare the signal level on the second data line of the channel switch against values of a low voltage reference and a high voltage reference; and a comparator logic latch configured to receive input signals from the dual level analog comparator, to perform a match against a logic expected value, and to report an error should the match not be obtained.

19. The test system as recited in claim 18, wherein, for each of the at least one channel switch, the comparator logic latch is configured to receive the logic expected value via the first data line of the channel switch.

* * * * *